United States Patent
Zhong et al.

(10) Patent No.: US 11,333,734 B2
(45) Date of Patent: May 17, 2022

(54) QUALITY AND SIGNAL-TO-NOISE RATIO OF FREE-BREATHING QUANTITATIVE MEASUREMENT OF MAGNETIC RESONANCE IMAGING PARAMETERS AND RELATED BIOMARKERS

(71) Applicant: Siemens Healthcare GmbH, Erlangen (DE)

(72) Inventors: Xiaodong Zhong, Oak Park, CA (US); Vibhas S. Deshpande, Austin, TX (US); Marcel Dominik Nickel, Herzogenaurach (DE); Xiaoming Bi, Oak Park, CA (US); Stephan Kannengiesser, Wuppertal (DE); Berthold Kiefer, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 230 days.

(21) Appl. No.: 16/868,848

(22) Filed: May 7, 2020

(65) Prior Publication Data
US 2021/0349166 A1 Nov. 11, 2021

(51) Int. Cl.
*G01R 33/567* (2006.01)
*G01R 33/56* (2006.01)
(Continued)

(52) U.S. Cl.
CPC ..... *G01R 33/5673* (2013.01); *G01R 33/5608* (2013.01); *G06T 3/0093* (2013.01); *G06T 7/0016* (2013.01); *G06T 11/008* (2013.01); *G06T 2207/10088* (2013.01); *G06T 2207/30056* (2013.01)

(58) Field of Classification Search
CPC ............ G01R 33/5673; G01R 33/5608; G06T 3/0093; G06T 7/0016; G06T 11/008; G06T 2207/10088; G06T 2207/30056
See application file for complete search history.

(56) References Cited

U.S. PATENT DOCUMENTS

2017/0328970 A1* 11/2017 Bi .......................... A61B 5/055

OTHER PUBLICATIONS

Yokoo, Takeshi, et al. "Nonalcoholic fatty liver disease: diagnostic and fat-grading accuracy of low-flip-angle multiecho gradient-recalled-echo MR imaging at 1.5 T." Radiology 251.1 (2009): 67-76.
(Continued)

*Primary Examiner* — G. M. A Hyder

(57) ABSTRACT

A method of generating biomarker parameters includes acquiring imaging data depicting a patient using a MRI system. The imaging data is acquired for a plurality of contrasts resulting from application of a pulse on the patient's anatomy. A process is executed to generate a MoCoAve image for each contrast. This process includes dividing the imaging data for the contrast into bins corresponding to one of a plurality of respiratory motion phases, and reconstructing the imaging data in each bin to yield bin images. The process further includes selecting a reference bin image from the bin images, and warping the bin images based on the reference bin image. The warped bin images and the reference bin image are averaged to generate the MoCoAve image for the contrast. One or more biomarker parameter maps are calculated based on the MoCoAve images generated for the contrasts.

20 Claims, 11 Drawing Sheets

(51) Int. Cl.
  *G06T 11/00* (2006.01)
  *G06T 7/00* (2017.01)
  *G06T 3/00* (2006.01)

(56) References Cited

OTHER PUBLICATIONS

Dixon, W. Thomas. "Simple proton spectroscopic imaging." Radiology 153.1 (1984): 189-194.
Glover, G. H., and E. Schneider. "Three-point Dixon technique for true water/fat decomposition with B0 inhomogeneity correction." Magnetic resonance in medicine 18.2 (1991): 371-383.
Ma, Jingfei. "Dixon techniques for water and fat imaging." Journal of Magnetic Resonance Imaging: An Official Journal of the International Society for Magnetic Resonance in Medicine 28.3 (2008): 543-558.
Reeder, Scott B., et al. "Quantitative assessment of liver fat with magnetic resonance imaging and spectroscopy." Journal of magnetic resonance imaging 34.4 (2011): 729-749.
Hussain, Hero K., et al. "Hepatic fat fraction: MR imaging for quantitative measurement and display—early axperience." Radiology 237.3 (2005): 1048-1055.
O'Regan, Declan P., et al. "Liver fat content and T2*: simultaneous measurement by using breath-hold multiecho MR imaging at 3.0 T—feasibility." Radiology 247.2 (2008): 550-557.
Guiu, Boris, et al. "Quantification of liver fat content: comparison of triple-echo chemical shift gradient-echo imaging and in vivo proton MR spectroscopy " Radiology 250.1 (2009): 95-102.
Yokoo, Takeshi, et al. "Estimation of hepatic proton-density fat fraction by using MR imaging at 3.0 T." Radiology 258.3 (2011): 749-759.
Koken, P., H. Eggers, and P. Börnert. "Fast single breath-hold 3D abdominal imaging with water-fat separation." Proc Intl Soc Magn Reson Med. vol. 15. 2007.
Yu, Huanzhou, et al. "Multiecho water-fat separation and simultaneous R estimation with multifrequency fat spectrum modeling." Magnetic Resonance in Medicine: An Official Journal of the International Society for Magnetic Resonance in Medicine 60.5 (2008): 1122-1134.
Zhong, Xiaodong, et al. "Liver fat quantification using a multi-step adaptive fitting approach with multi-echo GRE imaging." Magnetic resonance in medicine 72.5 (2014): 1353-1365.
Wood, John C., et al. "MRI R2 and R2* mapping accurately estimates hepatic iron concentration in transfusion-dependent thalassemia and sickle cell disease patients" Blood 106.4 (2005): 1460-1465.
Hankins, Jane S., et al. "R2* magnetic resonance imaging of the liver in patients with iron overload." Blood 113.20 (2009): 4853-4855.
Hernando, Diego, et al. "Quantification of liver iron with MRI: state of the art and remaining challenges." Journal of Magnetic Resonance Imaging 40.5 (2014): 1003-1021.
Hernando, Diego, J. Harald Kramer, and Scott B. Reeder. "Multipeak fat-corrected complex R2* relaxometry: theory, optimization, and clinical validation." Magnetic resonance in medicine 70.5 (2013): 1319-1331.
Armstrong, Tess, et al. "Free-breathing liver fat quantification using a multiecho 3 D stack-of-radial technique." Magnetic resonance in medicine 79.1 (2018): 370-382.
Peters, Dana C., J. Andrew Derbyshire, and Elliot R. McVeigh. "Centering the projection reconstruction trajectory: reducing gradient delay errors." Magnetic Resonance in Medicine: An Official Journal of the International Society for Magnetic Resonance in Medicine 50.1 (2003): 1-6.
Zhong, Xiaodong, et al. "Effect of respiratory motion on free-breathing 3D stack-of-radial liver relaxometry and improved quantification accuracy using self-gating." Magnetic Resonance in Medicine 83.6 (2020): 1964-1978.
Grimm, R., et al. "Self-gating reconstructions of motion and perfusion for free-breathing T1-weighted DCEMRI of the thorax using 3D stack-of-stars GRE imaging." Proceedings of the 20th scientific meeting, International Society for Magnetic Resonance in Medicine. 2012.
Grimm, Robert, et al. "Optimal channel selection for respiratory self-gating signals." Proc. 21st Annual Meeting SMRM, Salt Lake City, Utah, USA. 2013.
Bi, X., J. Pang, and W. Yang. "Improving respiratory phase-resolved 3D body imaging using iterative motion correction and average (MoCoAve)." Proc. Intl. Soc. Mag. Reson. Med. vol. 24. 2016.
Block, Kai Tobias, et al. "Towards routine clinical use of radial stack-of-stars 3D gradient-echo sequences for reducing motion sensitivity." Journal of the Korean Society of Magnetic Resonance in Medicine 18.2 (2014): 87-106.
Fujinaga, Yasunari, et al. "Advantages of radial volumetric breath-hold examination (VIBE) with k-space weighted mage contrast reconstruction (KWIC) over Cartesian VIBE in liver imaging of volunteers simulating inadequate or no breath-holding ability." European radiology 26.8 (2016): 2790-2797.
Reeder, Scott B., et al. "Referenceless interleaved echo-planar imaging " Magnetic Resonance in Medicine: An Official Journal of the International Society for Magnetic Resonance in Medicine 41.1 (1999): 87-94.
U.S. Appl. No. 16/837,216, filed Apr. 1, 2020.

\* cited by examiner

QUALITY AND SIGNAL-TO-NOISE RATIO OF FREE-BREATHING QUANTITATIVE MEASUREMENT OF MAGNETIC RESONANCE IMAGING PARAMETERS AND RELATED BIOMARKERS

TECHNOLOGY FIELD

The present invention relates generally to methods, systems, and apparatuses for implementing an improved quality and signal-to-noise ratio of free-breathing quantitative measurement of magnetic resonance imaging (MRI) parameters and related biomarkers. This may be applied, for example, during the assessment of proton density fat fraction (PDFF) and R2* in liver.

BACKGROUND

Measurement and evaluation of tissue biomarkers using magnetic resonance imaging (MRI) is of growing clinical interest. The values of biomarkers typically change due to the tissue property changes caused by diseases, and they have the potential of sensitively reflecting early disease stages compared to the qualitative diagnosis of the regular MR images. In addition, recording and comparing the biomarker values are especially valuable for treatment monitoring. Last but not least, the recent development of machine learning based algorithms evolves into the quantitative applications, which could further benefit from quantitative MRI.

Quantitative measurement and evaluation of liver fat or iron deposition are gaining growing clinical applications. Many diseases alter fat or iron deposition in the tissue compared to normal conditions. Proton density fat fraction (PDFF) is a well-established biomarker to evaluate fat overload. In addition, R2* is an emerging biomarker to evaluate iron overload, which has been shown to correlate well with liver iron concentration (LIC).

Three-dimensional (3D) breath-hold multi-echo gradient-echo (GRE) imaging is a well-validated technique for liver PDFF and R2* measurements; however, conventional methods using Cartesian sampling require breath-holding to avoid respiratory motion artifacts. In patient populations with breath-hold difficulties such as pediatric or elderly patients, free-breathing acquisition is necessary. Free-breathing quantitative MRI techniques are also beneficial to simplify the clinical workflow for MRI scanning. Due to its relative insensitivity to motion, 3D stack-of-radial imaging was proposed and validated for liver fat quantification using free-breathing acquisition. Recently, a study showed that the influence of respiratory motion on R2* quantification using free-breathing stack-of-radial imaging was evident, and proposed a self-gating thresholding approach to compensate respiratory motion for accurate liver R2* quantification. The main disadvantage of this self-gating thresholding approach is that only a portion of the acquired radial views are selected by the self-gating algorithm for reconstruction, leading to lower signal-to-noise ratio (SNR) and typically more serious streaking artifacts compared to the reconstruction with all acquired views.

Self-gating methods have also been applied in the 4D (respiratory phase-resolved 3D) MRI used in the radiotherapy, where respiratory motion information derived from the self-gating signal is used to retrospectively group the acquired k-space data into multiple bins representing different breathing phases. It was shown that a motion correction and average (MoCoAve) approach can be used to significantly improve SNR and image quality without compromising motion information in the 4D MRI. However, the performance of MoCoAve on multi-echo data and the subsequent PDFF and R2* quantification using free-breathing stack-of-radial imaging remains unclear.

SUMMARY

Embodiments of the present invention address and overcome one or more of the above shortcomings and drawbacks, by providing methods, systems, and apparatuses related to an improved quality and signal-to-noise ratio of free-breathing quantitative measurement of magnetic resonance imaging (MRI) parameters and related biomarkers.

According to some embodiments, a method of generating biomarker parameters includes acquiring imaging data depicting a patient using a MRI system. The imaging data is acquired for a plurality of contrasts resulting from application of a pulse on the patient's anatomy. A process is executed to generate a motion correction and average (MoCoAve) image for each contrast. This process includes dividing the imaging data for the contrast into a plurality of bin corresponding to one of a plurality of respiratory motion phases, and reconstructing the imaging data in each bin to yield a plurality of bin images. The process further includes selecting a reference bin image from the plurality of bin images, and warping the plurality of bin images based on the reference bin image, thereby yielding a plurality of warped bin images. The warped bin images and the reference bin image are averaged to generate the MoCoAve image for the contrast. One or more biomarker parameter maps are calculated based on the MoCoAve images generated for the plurality of contrasts.

According to other embodiments, a method of generating biomarker parameters includes acquiring imaging data depicting a patient using an MRI system. The imaging data is acquired for a plurality of contrasts resulting from application of a pulse on the patient's anatomy. Next, a process is executed to generate images for each contrast. This process includes dividing the imaging data for the contrast into a plurality of bins corresponding to one of a plurality of respiratory motion phases, and reconstructing the imaging data in each bin to yield a plurality of bin images. A biomarker parameter map is calculated for each bin based on the bin images in the bin. A reference biomarker parameter map is selected from the biomarker parameter maps generated for each bin. The biomarker parameter maps are warped to the reference biomarker parameter map. The warped biomarker parameter maps are averaged with the reference biomarker parameter map to generate a MoCoAve parameter map.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, the drawings show embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses for performing a multi-echo GRE stack-of-radial MRI acquisition with gradient delay correction and self-gating respiratory motion compensation. More specifically, a free-breathing MRI method is described herein that utilizes stack-of-radial imaging acquisition with self-gating, multi-binning MoCoAve and multi-echo Dixon techniques to provide improved image quality and SNR of the assessment of PDFF and R2* in liver, as well as further derived biomarkers such as LIC. The disclosed method can be extended to assess other MR parameters and biomarkers including, but not limited to, T1, T2/R2 and Magnetic Resonance Elastography (MRE), and other potential applications such as liver stiffness assessment. Although the following discussion focuses on a stack-of-radial sequence; it should be understood that the general techniques discussed herein can also be applied to other sequence types, including, but not limited to, a 3D radial (e.g., Koosh-ball) sequence.

Figure 1A:
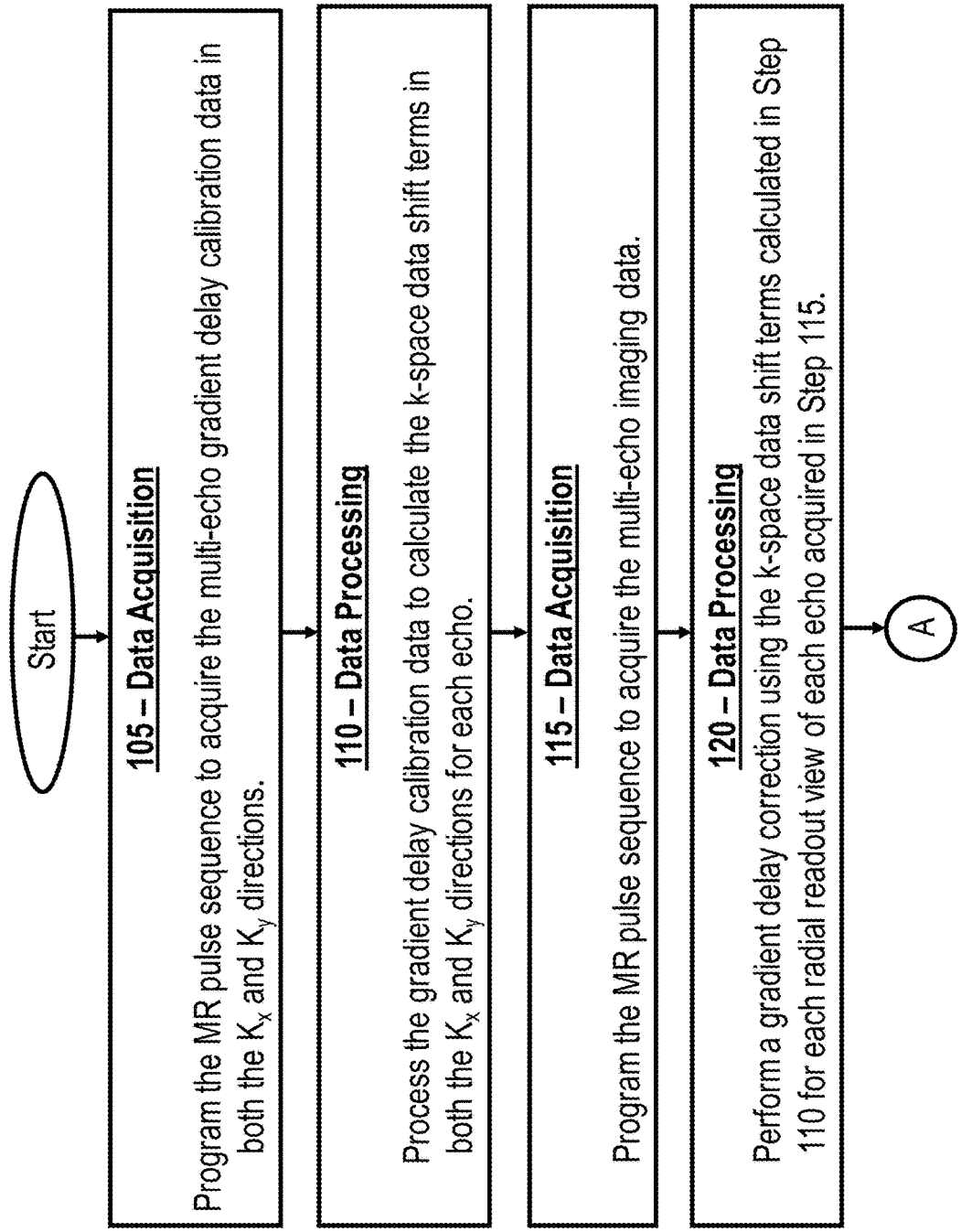
FIGS. 1A-1B show a flow chart depicting the data acquisition and data processing steps for the proposed free-breathing MRI method utilizing stack-of-radial imaging acquisition with self-gating and MoCoAve and multi-echo Dixon techniques, according to some embodiments.
Figure 1B:
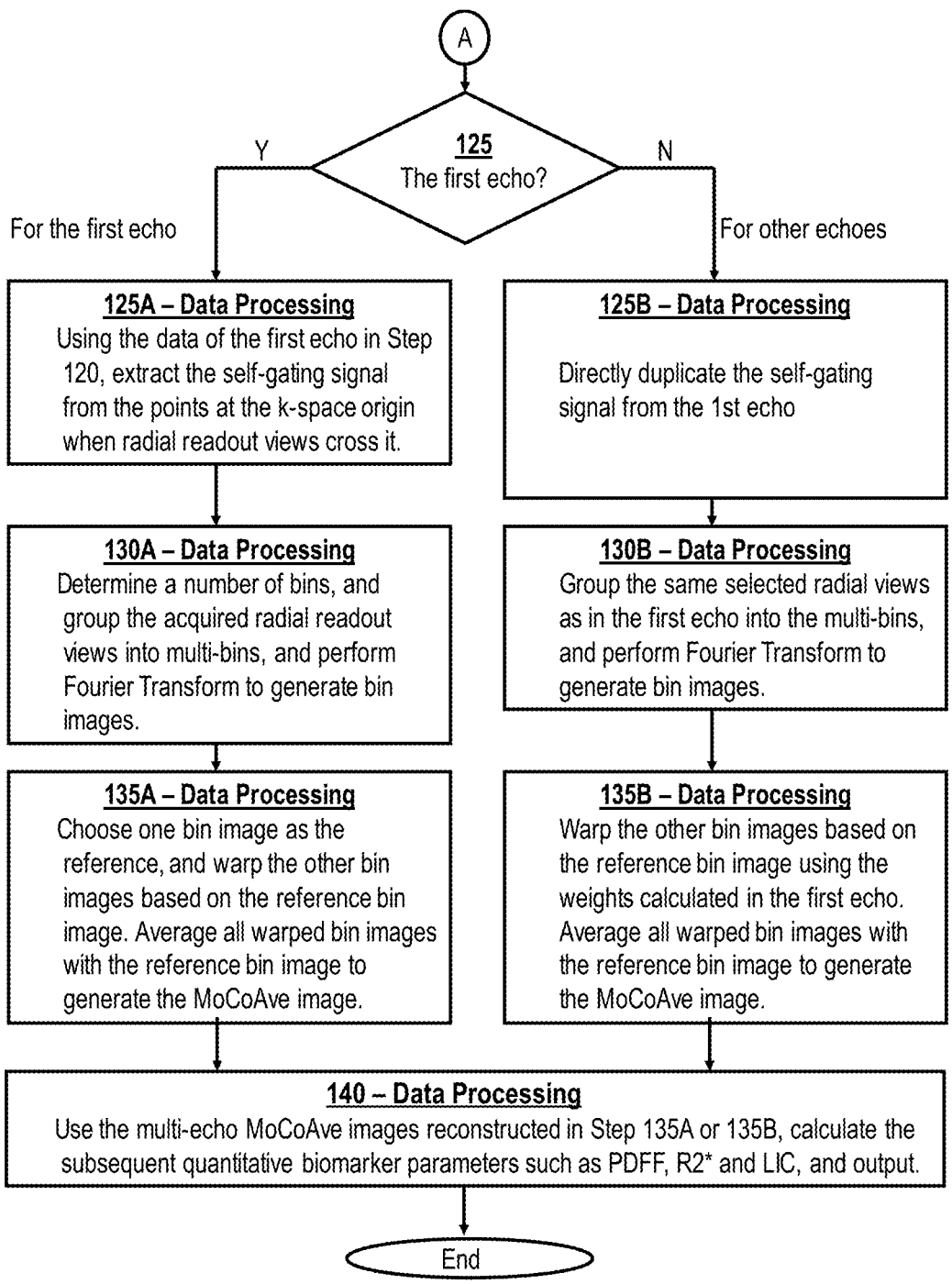

FIGS. 1A-1B show a flow chart depicting the data acquisition and data processing steps for the proposed free-breathing MRI method utilizing stack-of-radial imaging acquisition with self-gating and MoCoAve and multi-echo Dixon techniques, according to some embodiments. Briefly, in this embodiment, a free-breathing multi-echo GRE stack-of-radial imaging sequence with golden-angle ordering is used for the data acquisition. The acquired k-space data go through the data processing steps including gradient delay correction, self-gating, multi-binning MoCoAve and quantification of PDFF and R2*, as described subsequently.

Example free-breathing multi-echo GRE stack-of-radial imaging sequences that may be used with the techniques described herein are described in: Zhong X, Armstrong T, Nickel M D, Kannengiesser S A R, Pan L, Dale B M, Deshpande V D, Kiefer B, Wu H H. Effect of respiratory motion on free-breathing three-dimensional stack-of-radial liver R2* relaxometry and improved quantification accuracy using self-gating. Magn Reson Med 2019. Example golden angle ordering schemes are described in Block K T, Chandarana H, Milla S, Bruno M, Mulholland T, Fatterpekar G, Hagiwara M, Grimm R, Geppert C, Kiefer B, Sodickson D K. Towards routine clinical use of radial stack-of-stars 3D gradient-echo sequences for reducing motion sensitivity. J Korean Soc Magn Reson Med 2014; 18:87-106; and Fujinaga Y, Kitou Y, Ohya A, Adachi Y, Tamaru N, Shiobara A, UedaH, Nickel M D, Maruyama K, Kadoya M. Advantages of radial volumetric breath-hold examination (VIBE) with k-space weighted image contrast reconstruction (KWIC) over Cartesian VIBE in liver imaging of volunteers simulating inadequate or no breath-holding ability. Eur Radiol 2016; 26:2790-2797.

The self-gating multi-binning MoCoAve technique discussed herein can be applied to other free-breathing imaging methods which need multiple measurements in one data dimension, (e.g., multiple echoes at different TEs), Other possible sequences include, without limitation, free-breathing T1, T2 and MRE with the radial-based and spiral-based acquisitions. The technique may also be applied to derived parameter maps (i.e., the averaging applied not to the contrast images, but to parameter maps derived for each motion state).

Starting at step 105 in FIG. 1A, an initial data acquisition procedure is performed. For this acquisition, the MR pulse sequence is programmed to acquire the multi-echo gradient delay calibration data in both the $K_x$ and $K_y$ directions. Next, at step 110, a data processing procedure is performed to process the gradient delay calibration data to calculate the k-space data shift terms in both the $K_x$ and $K_y$ directions for each echo.

Continuing with reference to FIG. 1A, a second data acquisition procedure is performed at step 115. Here, the MR pulse sequence is programmed to acquire the multi-echo imaging data. Then, at step 120, a second data processing step is performed. During this step 120, gradient delay correction is performed using the k-space data shift terms calculated in Step 110 for each radial readout view of each echo acquired in Step 115.

The process illustrated on FIG. 1A continues on FIG. 1B. One of two processing sequences is executed, depending on whether the first echo 125 is being processed or subsequent echoes. For a specific echo (usually the first echo, but could be other echoes), the data processing sequence of steps 125A, 130A, and 135A is executed. Starting at step 125A, the data of the specific echo is used to extract the self-gating signal from the points at the k-space origin when radial readout views cross it. Next, at Step 130A, a number of bins is determined empirically (e.g., 5 bins), and the acquired radial readout views are grouped into multi-bins. Then, a Fourier Transform is performed to generate bin images. Then, at Step 135A, one bin image selected as the reference. The other bin images are warped using any applicable non-rigid image registration algorithms based on the reference bin image. The warped bin images are averaged together with the reference bin image to generate the MoCoAve image.

If the echo being processed is not the first echo, the sequence set forth in Steps 125B, 130B, and 135B is executed. At Step 125B, the self-gating signal from the 1st echo is directly duplicated or used. Next, at Step 130B, the same radial views as in the first echo (see Step 130A) are grouped into the multi-bins. A Fourier Transform is performed on the multi-bins to generate bin images. Then, at Step 135B, the other bin images are warped based on the reference bin image (selected in Step 135A) using the weights calculated in the first echo. Finally, the warped bin images are averaged with the reference bin image to generate the MoCoAve image.

Regardless of whether the first echo or subsequent echoes are being processed, at Step 140A the multi-echo MoCoAve images reconstructed in Step 135A or 135B are used to calculate the subsequent quantitative biomarker parameters such as PDFF, R2* and LIC. Techniques for calculating biomarkers are generally understood in the art; and, in general, any method may be applied at Step 140A.

In some embodiments, self-gating multi-binning MoCoAve can be performed in the data of each echo separately. The strategy and performance depend on the characteristics and needs of the specific applications. In embodiments where multi-echo data is acquired, self-gating multi-binning MoCoAve may be performed in the data of one echo, and the extracted self-gating signal, calculated weights (i.e., deformation fields for performing the warping), and other parameters are directly applied to the data of the other echoes. This assures the motion correction of all the echoes is consistent and does not introduce errors in the subsequent biomarker calculation. Alternatively the motion fields may be jointly estimated using all contrasts (i.e., echoes) at once.

Figure 1C:
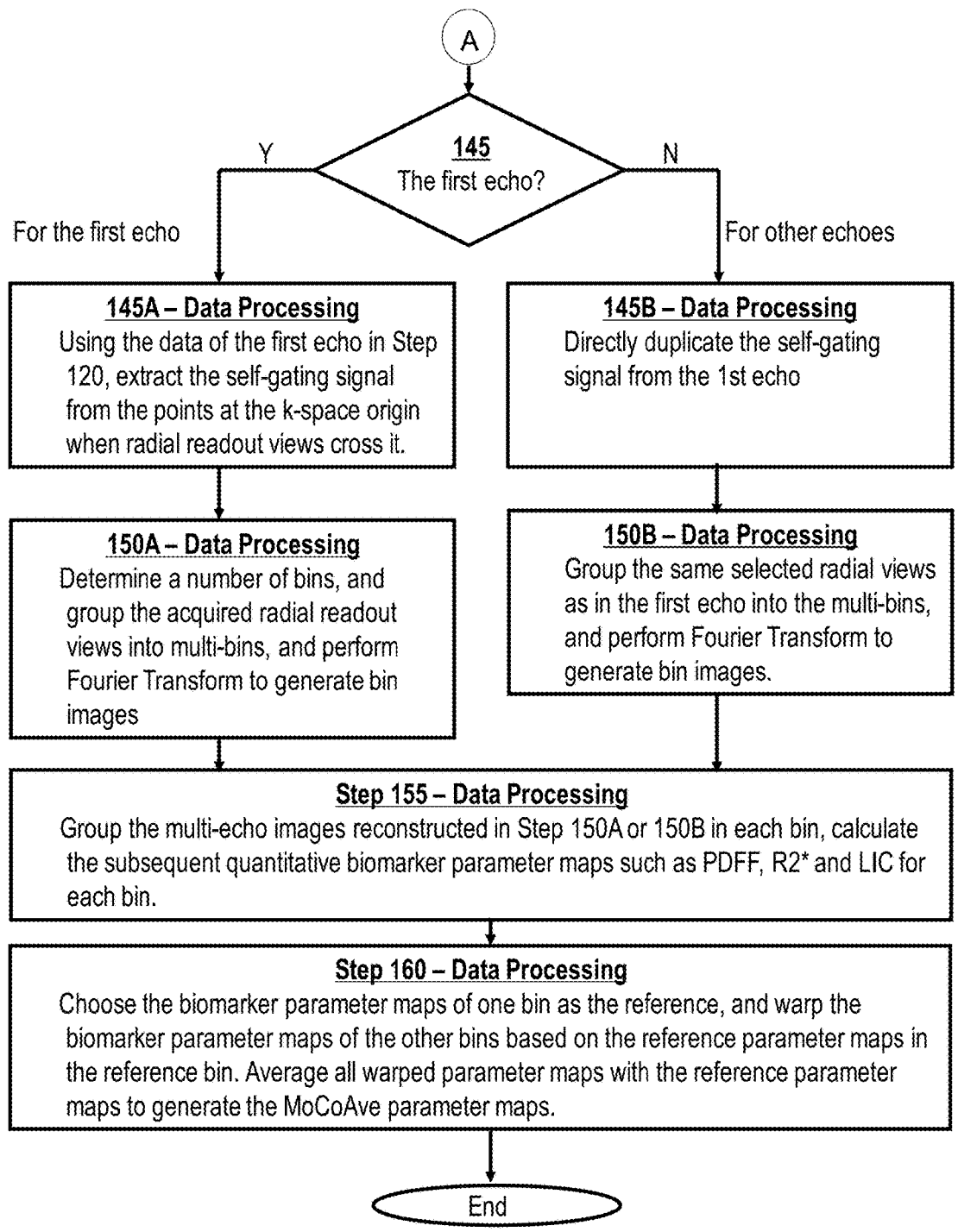
FIG. 1C shows an alternative implementation of the data acquisition and data processing steps shown in FIG. 1B.

FIG. 1C shows an alternate implementation of the process shown in FIG. 1B. In FIG. 1C, steps 145, 145A-150A and 145A-150B are implemented as discussed above with reference to steps 125, 125A-130A and 125B-130B of FIG. 1B. At step 155, the multi-images reconstructed at step 150A or step 150B are grouped in each bin. The subsequent quantitative biomarker parameter maps are calculated for each bin. Then, at step 160, one of the biomarker parameter maps are selected for reference. The biomarker parameter maps are warped based on the reference parameter maps in the reference bin. Then, the warped parameter maps are averaged with the reference parameter maps to generate the MoCoAve parameter maps.

Recently, studies have shown that gradient delay error correction is necessary for free-breathing stack-of-radial MRI to provide accurate liver fat quantification. Thus in some embodiments, a gradient delay calibration acquisition is performed before the sequence starts to acquire stack-of-radial imaging data, where the calibration data is then used to correct the gradient delay error in the subsequent imaging data.

Figure 2A:
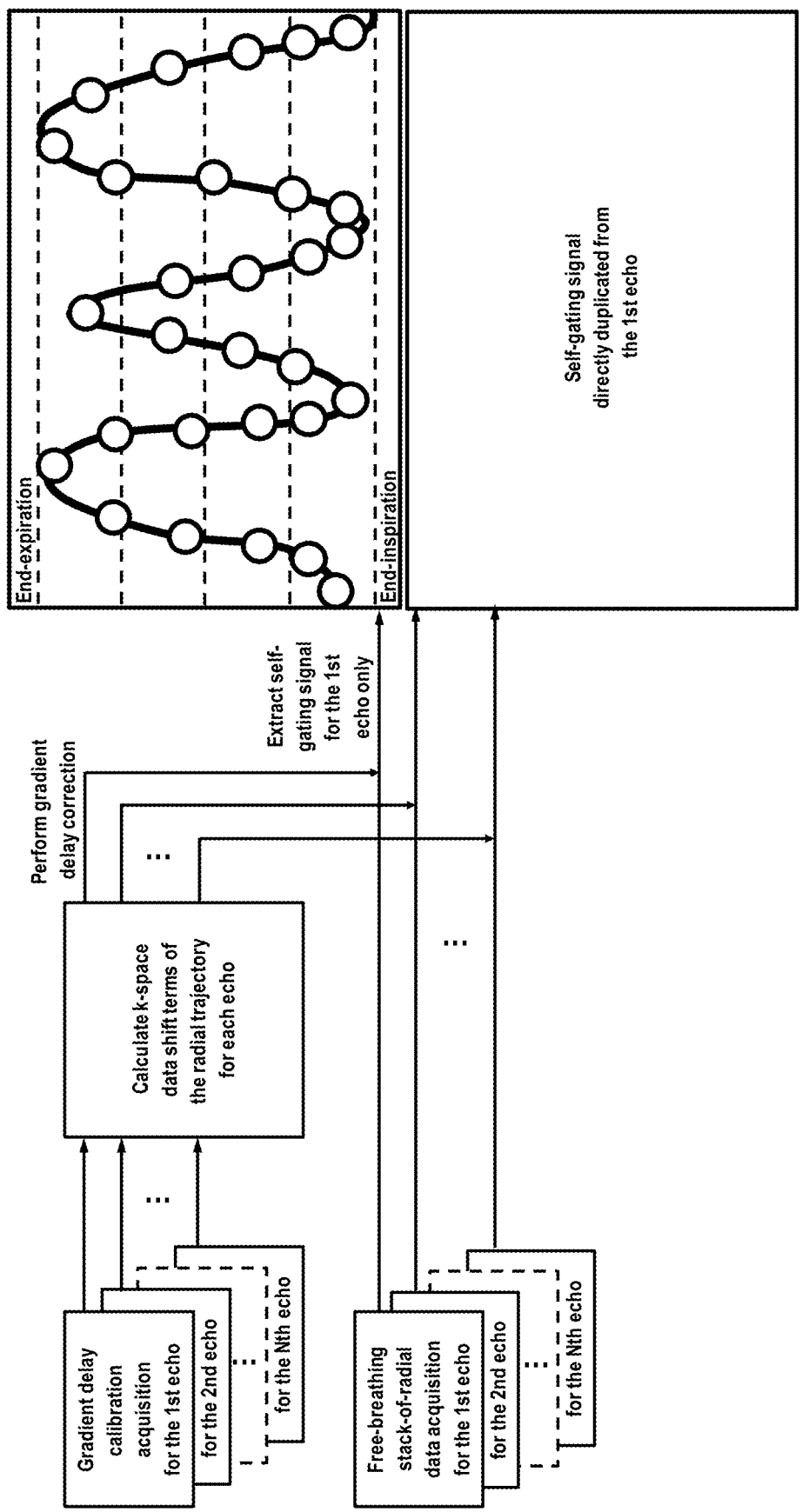
FIGS. 2A-2C shows a block figure of the data acquisition and data processing steps corresponding to the method shown in FIG. 1A and FIG. 1B.
Figure 2B:
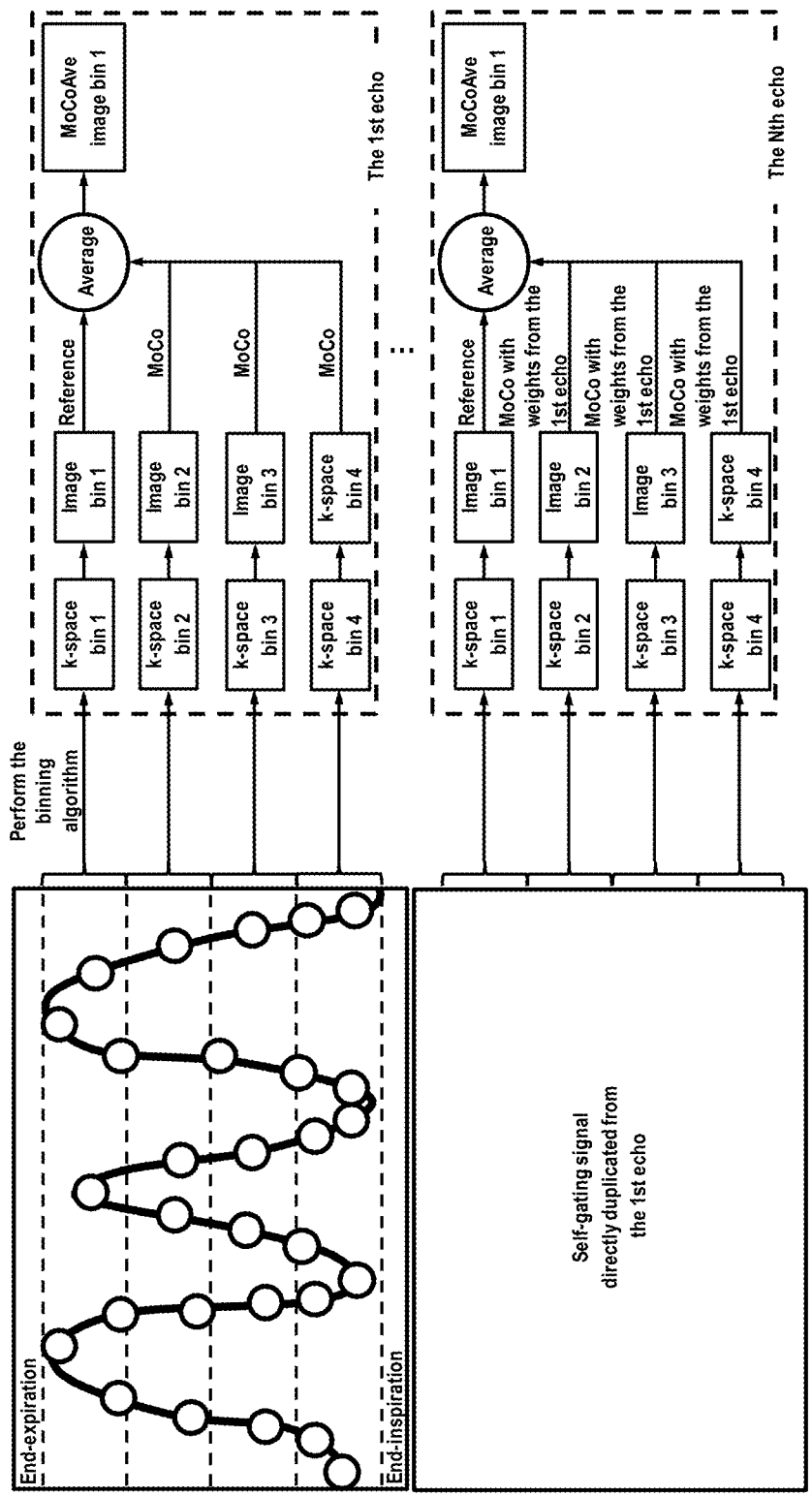
Figure 2C:
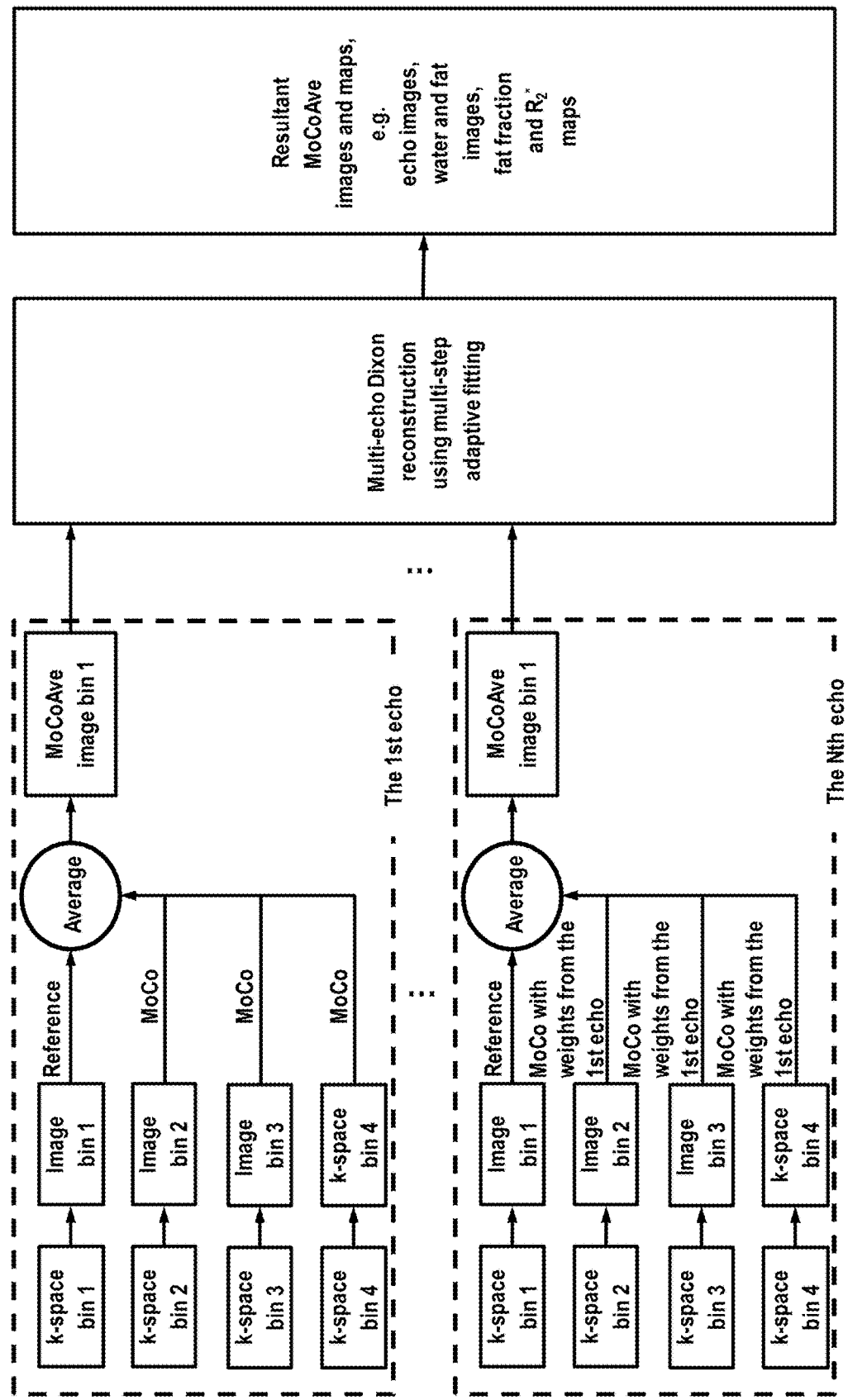

FIGS. 2A-2C show a block figure of the data acquisition and data processing steps that may be executed in some embodiments of the present invention. This example provides a detailed illustration of the motion correction and average processing using multi-bin images corresponding to the different respiratory motion phases extracted from the self-gating signal for the free-breathing stack-of-radial data. Note that there is overlap between the figures to show the overall sequence; thus, FIG. 2B includes a portion that overlaps with FIG. 2A and FIG. 2C includes a portion that overlaps with FIG. 2B.

As shown in FIG. 2A, a self-gating signal is retrospectively extracted in a single continuous free-breathing scan acquired with a stack-of-radial imaging acquisition. The data points of the radial readout views at the k-space origin are sampled as the corresponding self-gating signal. Example sampling techniques are described in U.S. patent application Ser. No. 16/837,216 filed Apr. 1, 2020 and entitled "Multi-Echo Radial Look-Locker Imaging for Simultaneous T1 and Fat Fraction Quantification" the entirety of which is incorporated herein by reference. This self-gating signal is then used to characterize the respiratory motion curve and determine the respiratory motion phases. As shown in FIG. 2B, the acquired radial readout views are grouped into multiple bins corresponding to the respective respiratory motion phases, and subsequently the bin images are reconstructed. One bin image of interest, typically at the end-expiration phase, is used as a reference for the MoCoAve algorithm. The other bin images are warped based on the reference bin image, and then averaged along with the reference bin image to generate the MoCoAve image.

As shown in FIG. 2C multi-Dixon reconstruction is performed using a multi-step adaptive fitting approach to generate MoCoAve images and maps such as echo images, water and fat images, PDFF, $R_2$ maps, etc. This approach is described in further detail in Zhong, X., Nickel, M. D., Kannengiesser, S. A., Dale, B. M., Kiefer, B. and Bashir, M. R. (2014), Liver fat quantification using a multi-step adaptive fitting approach with multi-echo GRE imaging. Magn. Reson. Med., 72: 1353-1365. doi:10.1002/mrm.25054. In general, Dixon imaging uses multiple acquisitions with different echo times to achieve fat-water phase differences and subsequently separate fat and water images. A fat fraction map, which is defined as the value of fat/(water+fat) for each pixel on the image, can then be generated to provide a fat quantitative after correcting for the confounders. Simultaneously, the maps of tissue transverse relaxation values (T2 or T2*) or relaxation rates (R2=1/T2 or R2*=1/T2*) are calculated when calculating the fat fraction maps, which are strong indicators of the iron content. In addition, it can be assessed directly, or alternatively converted to LIC values for iron estimation. In some embodiments, the motion compensated and averaged multi-echo data are processed using the multi-step adaptive fitting algorithm to calculate the PDFF, R2* values. In some embodiments, the calculation of parameter maps can be performed for each self-gated bin, and MoCoAve can be subsequently performed in the parameter maps of each bin.

Figure 3A:
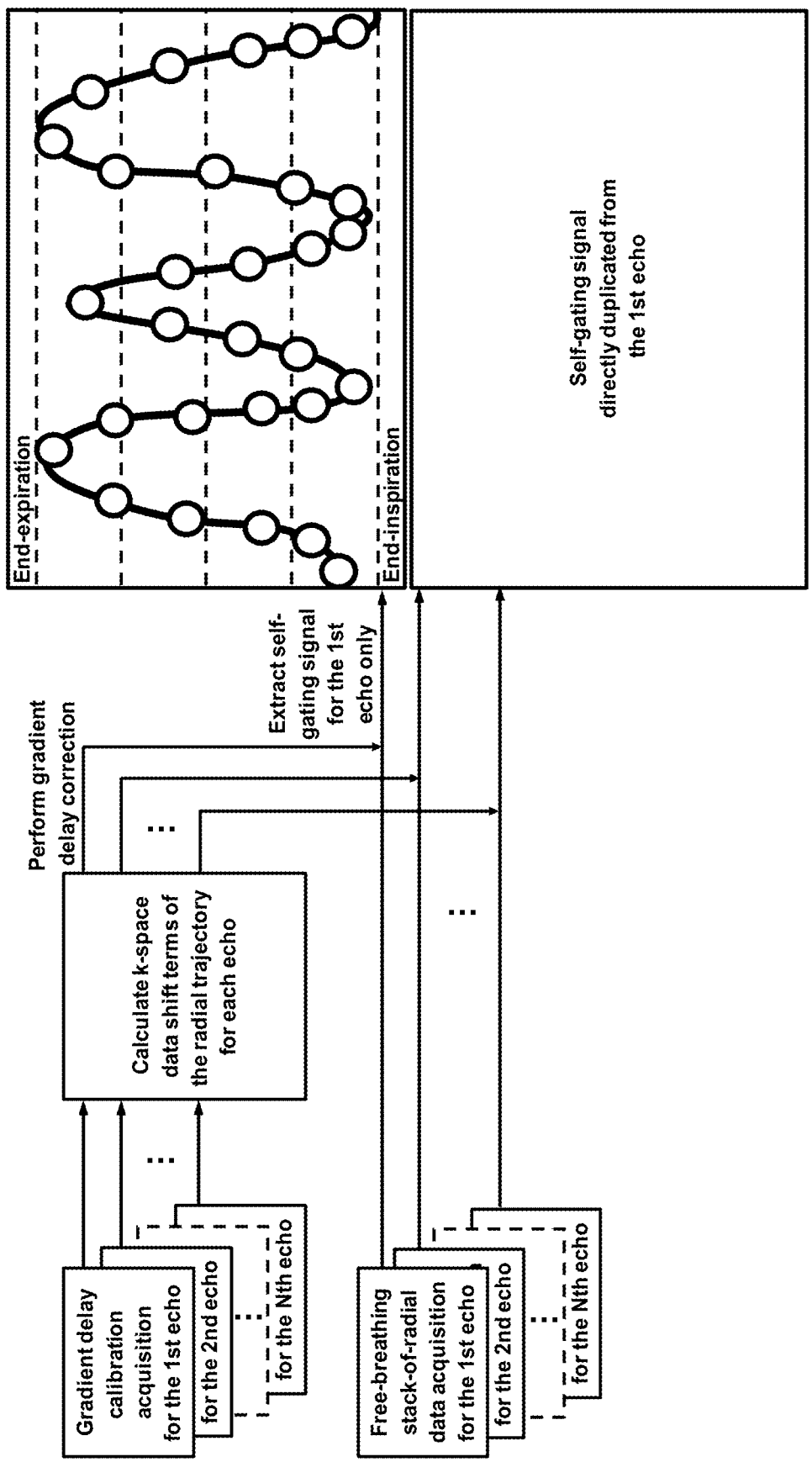
FIGS. 3A-3C shows a block figure of the data acquisition and data processing steps corresponding to the method shown in FIG. 1A and FIG. 1C.
Figure 3B:
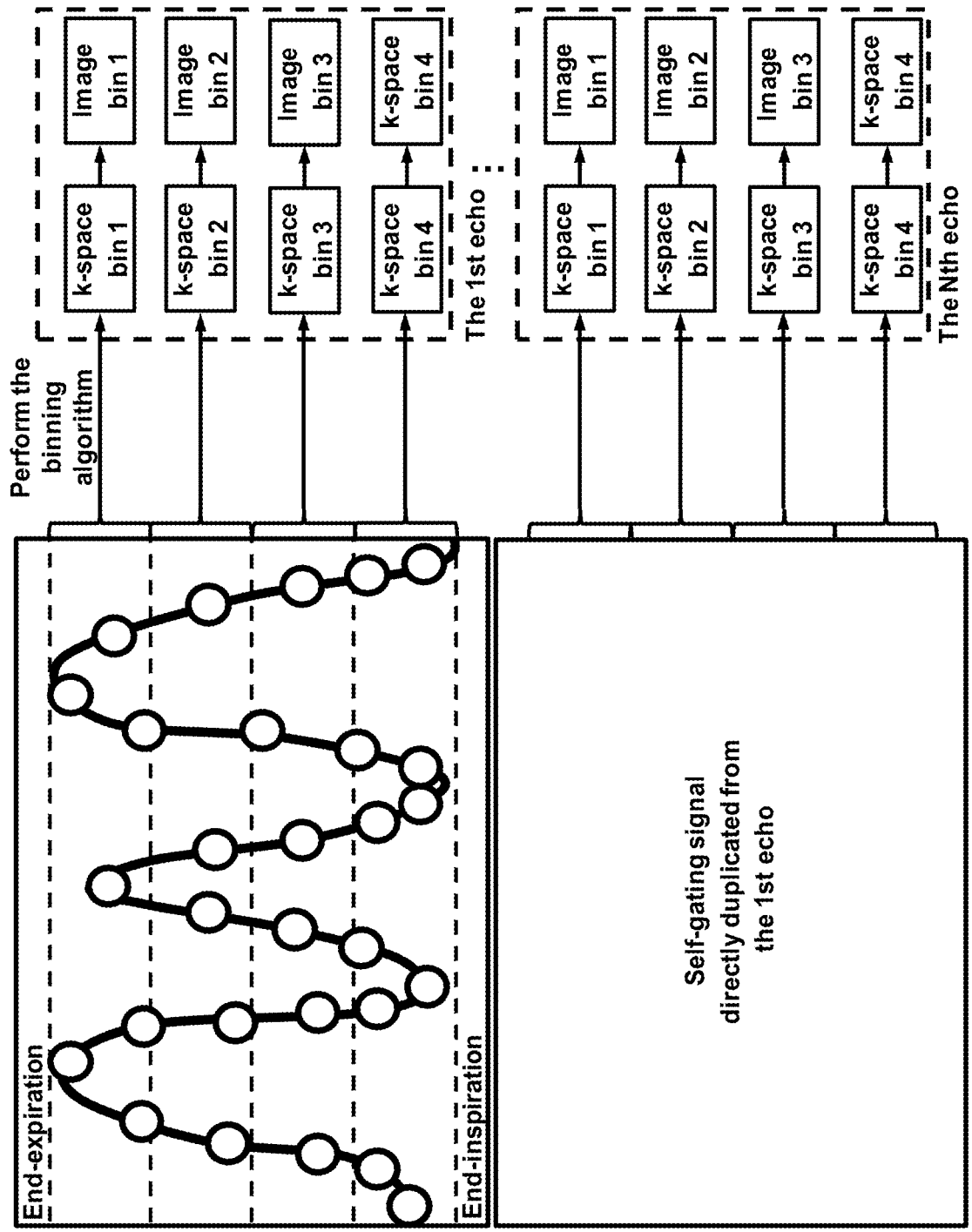
Figure 3C:
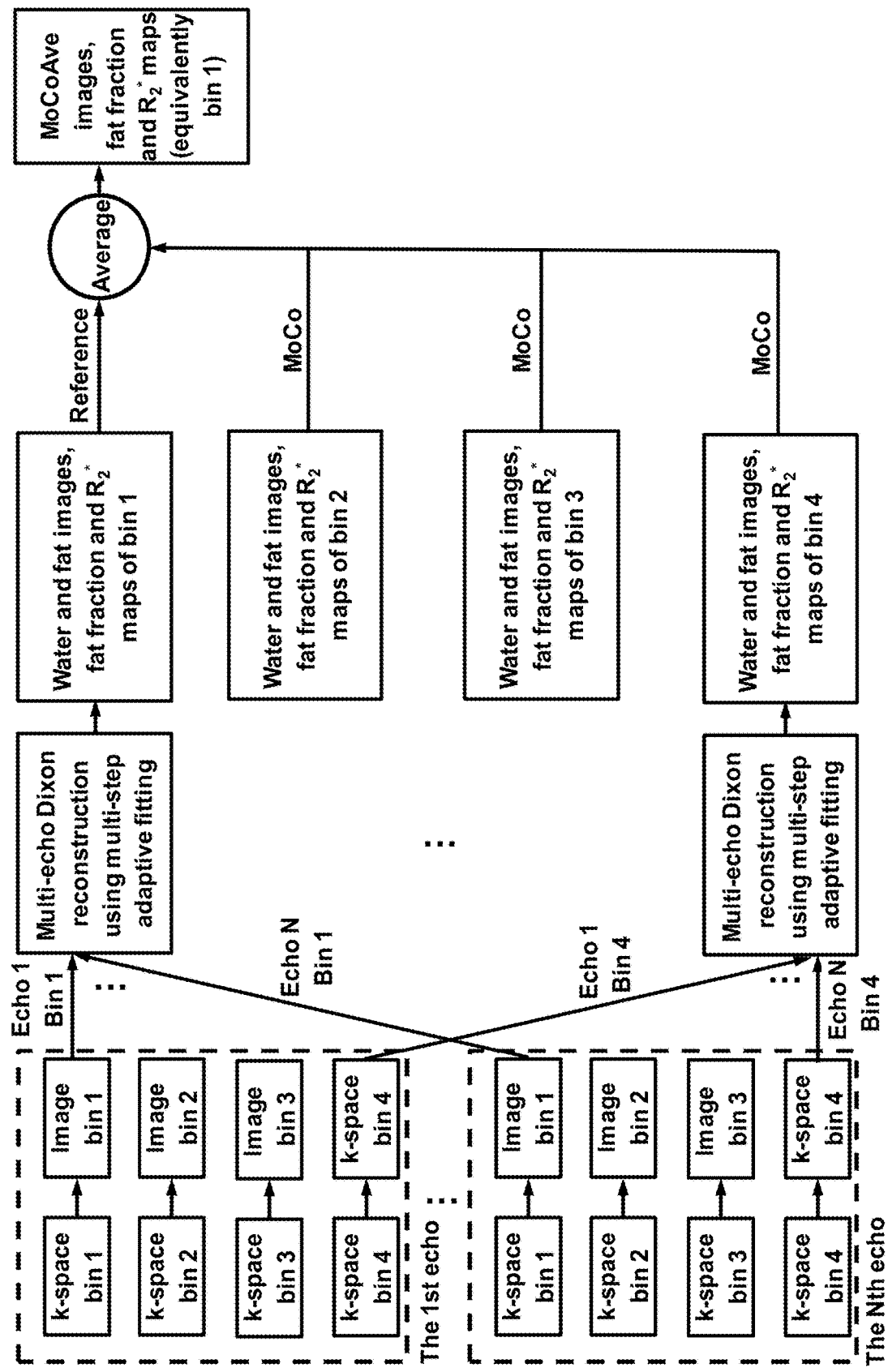

FIGS. 3A-3C show an alternate implementation of the data acquisition and data processing steps shown in FIGS. 2A-2C. This alternate implementation follows the process shown in FIG. 1A and FIG. 1C. The calculation of the PDFF, R2* maps is performed for each bin first, using the multi-step adaptive fitting algorithm. The PDFF and R2* maps of one bin, typically at the end-expiration phase, are used as a reference. The PDFF and R2* maps of the other bin images are warped based on the reference PDFF and R2* maps. Then, the maps are averaged together with the reference PDFF and R2* maps to generate the resultant MoCoAve PDFF and R2* maps.

The self-gating multi-binning MoCoAve technique is one example used for utilizing the data of other respiratory motion phases to improve the image quality and biomarker measurement in one specific respiratory motion phase. Other approaches for assigning acquired data to motion states can be used as alternatives, such as physiological signal measured by specific hardware. For example, in one embodiment a respiratory signal is generated by tracking a physiological characteristic related to the patient's breathing using a sensor external to the MRI system. The respiratory phases may then be determined based on the respiratory signal.

Figure 4:
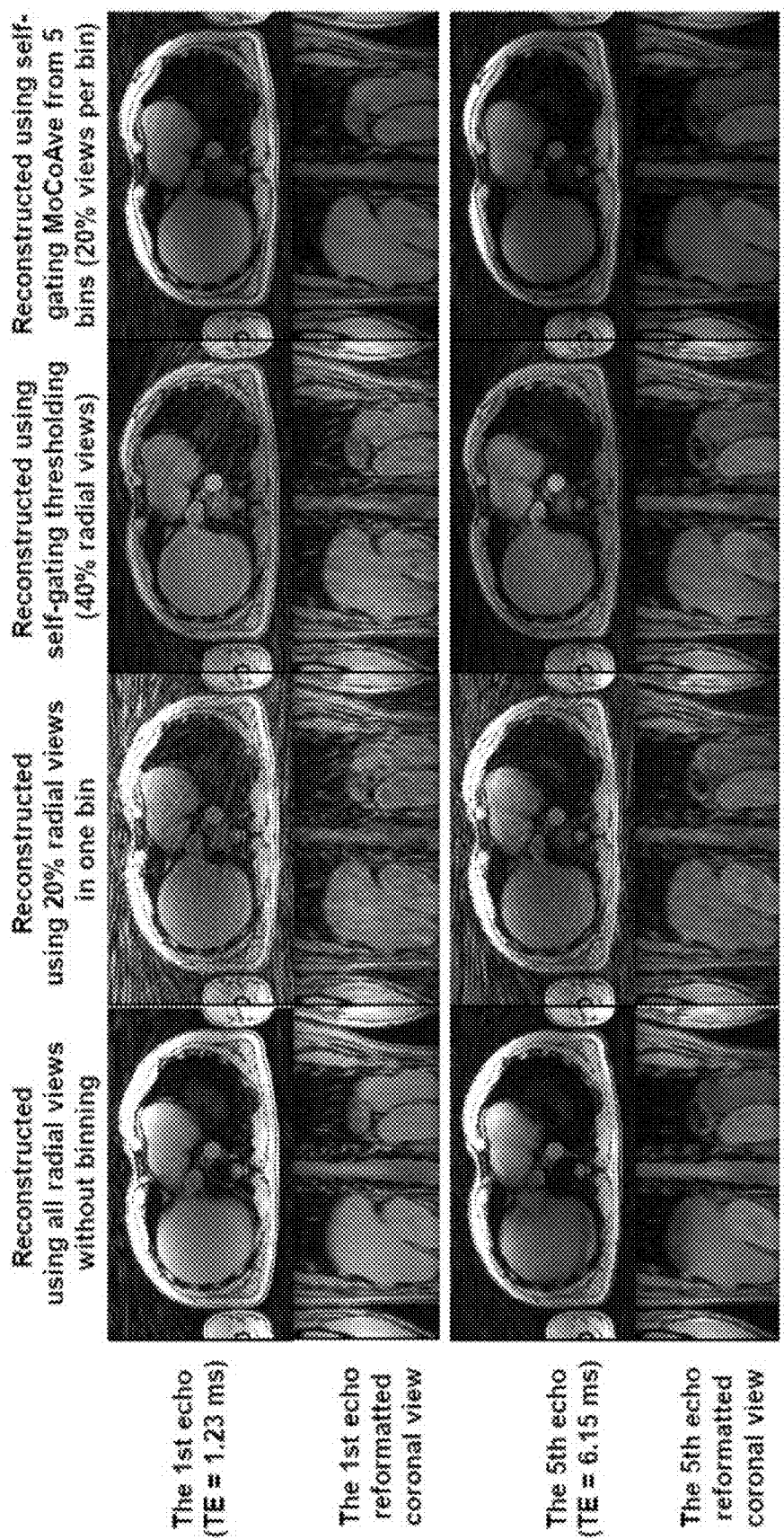
FIG. 4 shows example echo images of two different TEs reconstructed using different methods from one subject.

FIG. 4 shows example echo images of two different TEs reconstructed using different methods from one subject. Images were cropped and window/level values were adjusted separately for better visualization. The first column of images depicts free-breathing stack-of-radial reconstructed with all the radial views without self-gating binning for motion compensation. These images show signal attenuation or void near the edge of the liver dome in the 5th echo image. The images reconstructed using 20% radial views in one bin are shown in the second column of FIG. 4. These images do not exhibit signal attenuation, but show low SNR and severe streaking artifacts. The third column of FIG. 4 shows images reconstructed using the self-gating thresholding method with 40% radial views. These images demonstrate improved image quality compared to the results reconstructed using 20% radial views in one bin (the second column in FIG. 4), however, its SNR is still relatively low since only 40% radial views were used for reconstruction. Finally, the results of the self-gating multi-binning MoCoAve method disclosed herein are shown in the fourth column in FIG. 4. Note that there is no signal attenuation or void near the edge of the liver dome is observed, and the image quality is further improved with a similar SNR to that of the results reconstructed using all radial views (the first column in FIG. 4).

It should be noted that, although the techniques are described above with reference to "echoes," the techniques can generally be applied to any type of contrast. Thus, the techniques may be used to calculate biomarkers that do not operate on echoes, as well as those that do. For biomarkers that do not operate on echoes the relevant variables may be different, such as images with different inversion recovery times, images with different encoding directions or strengths, etc.

Figure 5:
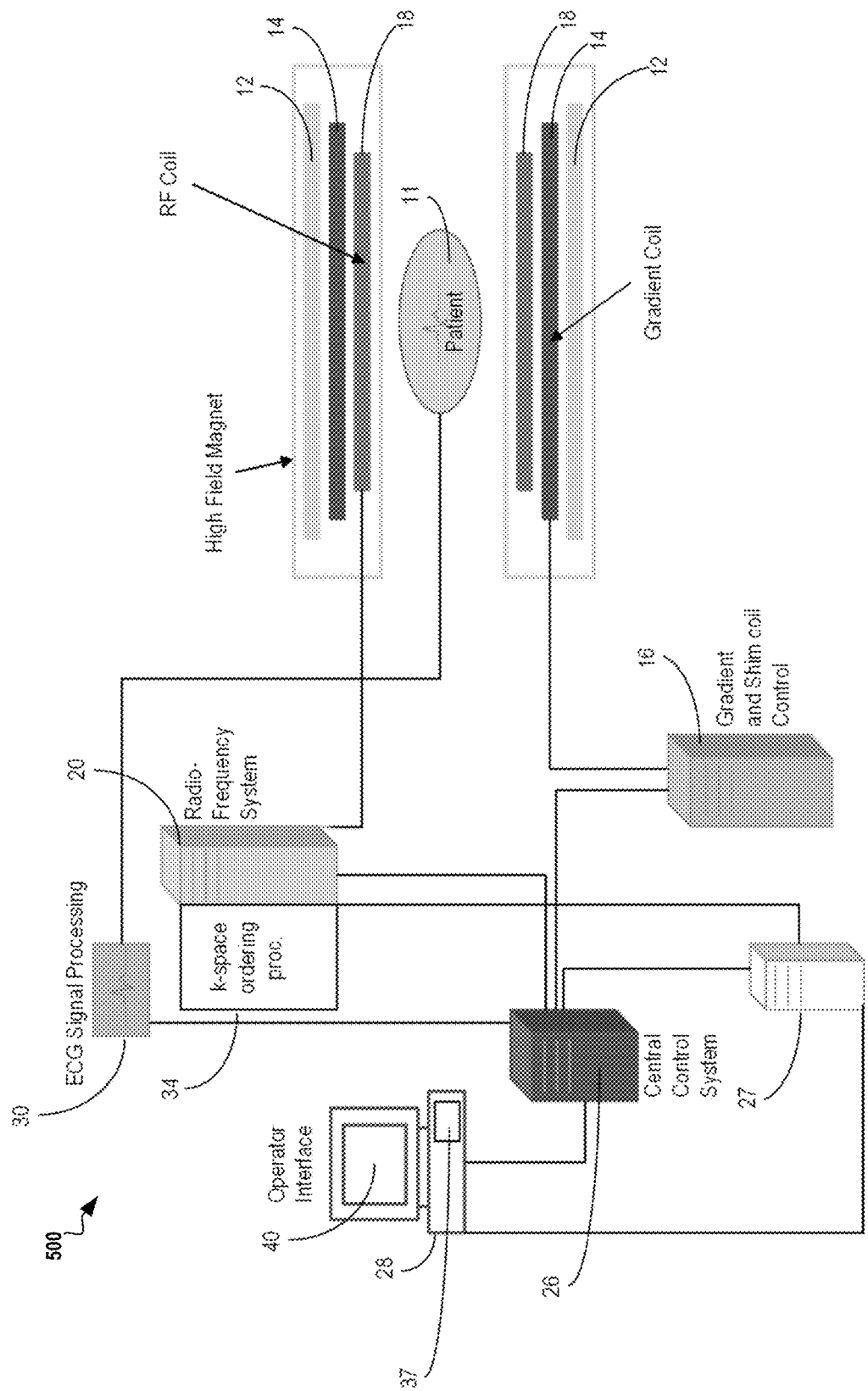
FIG. 5 shows a system for ordering acquisition of frequency domain components representing magnetic resonance (MR) image data for storage in a k-space storage array, as used by some embodiments of the present invention.

FIG. 5 shows a system 500 for ordering acquisition of frequency domain components representing MR image data for storage in a k-space storage array, as used by some embodiments of the present invention. In system 500, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11. For example, as described in greater detail below, in some embodiments, the central control unit 26 directs the various components of the system 500 to acquire radial k-space data using free-breathing stack-of-radial MRI pulse sequence described above with reference to FIGS. 1A-1C.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control unit 26. However, in other embodiments such as the one depicted in FIG. 5, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising an MR dataset. The k-space array of individual data elements has a designated center and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components are sequentially acquired during acquisition of an MR dataset representing an MR image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice(s) of the body (e.g., using the image data processor) and adjusts other parameters of system 500. The stored information comprises predetermined pulse sequence and magnetic field gradient and strength data as well as data indicating timing, orientation and spatial volume of gradient magnetic fields to be applied in imaging. Generated images are presented on display of the operator interface 40. Computer 28 of the operator interface includes a graphical user interface (GUI) enabling user interaction with central control unit 26 and enables user modification of magnetic resonance imaging signals in substantially real time. Display processor 37 processes the magnetic resonance signals to provide image representative data for display on operator interface 40, for example.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

The term "computer readable medium" as used herein refers to any medium that participates in providing instructions to the processor for execution. A computer readable medium may take many forms including, but not limited to, non-volatile media, volatile media, and transmission media.

Non-limiting examples of non-volatile media include optical disks, solid state drives, magnetic disks, and magneto-optical disks, such as hard disk or removable media drive. One non-limiting example of volatile media is dynamic memory. Non-limiting examples of transmission media include coaxial cables, copper wire, and fiber optics, including the wires that make up one or more buses. Transmission media may also take the form of acoustic or light waves, such as those generated during radio wave and infrared data communications.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine-readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f), unless the element is expressly recited using the phrase "means for."

We claim:

1. A method of generating biomarker parameters using a magnetic resonance imaging (MRI) system, the method comprising:
   acquiring imaging data depicting a patient using a MRI system, wherein the imaging data is acquired for a plurality of contrasts resulting from application of a pulse on the patient's anatomy;
   for each contrast of the plurality of contrasts, generating a motion correction and average (MoCoAve) image using a process comprising:
      dividing the imaging data for the contrast into a plurality of bins corresponding to one of a plurality of respiratory motion phases;
      reconstructing the imaging data in each bin to yield a plurality of bin images;
      selecting a reference bin image from the plurality of bin images;
      warping the plurality of bin images based on the reference bin image, thereby yielding a plurality of warped bin images;
      averaging the warped bin images and the reference bin image to generate the MoCoAve image for the contrast; and
   calculating one or more biomarker parameter maps based on the MoCoAve images generated for the plurality of contrasts.

2. The method of claim 1, wherein the reference bin image corresponds to an end-expiration phase included in the plurality of respiratory motion phases.

3. The method of claim 1, further comprising:
   extracting a self-gating signal from the imaging data; and
   using the self-gating signal to determine the plurality of respiratory motion phases associated with the acquisition of the imaging data.

4. The method of claim 3, wherein a separate self-gating signal is extracted for each contrast included in the plurality of contrasts.

5. The method of claim 1, wherein the imaging data is acquired using a radial imaging sequence.

6. The method of claim 5, wherein the self-gating signal is extracted from the imaging data by sampling a plurality of radial views included in the imaging data.

7. The method of claim 1, further comprising:
   generating a respiratory signal by tracking a physiological characteristic related to the patient's breathing using a sensor external to the MRI system; and
   determining the plurality of respiratory motion phases based on the respiratory signal.

8. The method of claim 1, wherein the imaging data is acquired using a 3D radial sequence.

9. The method of claim 1, wherein the biomarker parameter maps comprise a Proton density Fat Fraction (PDFF) parameter map.

10. The method of claim 1, wherein the biomarker parameter maps comprise a transverse relaxation rate ($R_2^*$) parameter map.

11. A method of generating biomarker parameters using a magnetic resonance imaging (MRI) system, the method comprising:
   acquiring imaging data depicting a patient using the MRI system, wherein the imaging data is acquired for a plurality of contrasts resulting from application of a pulse on the patient's anatomy;
   for each contrast of the plurality of contrasts, generating images using a process comprising:
      dividing the imaging data for the contrast into a plurality of bin corresponding to one of a plurality of respiratory motion phases, and
      reconstructing the imaging data in each bin to yield a plurality of bin images;
   for each bin, calculating a biomarker parameter map based on the bin images in the bin;
   selecting a reference biomarker parameter map from the biomarker parameter maps generated for each bin;
   warping the biomarker parameter maps to the reference biomarker parameter map, thereby yielding a plurality of warped biomarker parameter maps;
   averaging the warped biomarker parameter maps with the reference biomarker parameter map to generate a MoCoAve parameter map.

12. The method of claim 11, wherein the reference biomarker parameter map corresponds to an end-expiration phase included in the plurality of respiratory motion phases.

13. The method of claim 11, further comprising:
    extracting a self-gating signal from the imaging data; and
    using the self-gating signal to determine the plurality of respiratory motion phases associated with the acquisition of the imaging data.

14. The method of claim 13, wherein a separate self-gating signal is extracted for each contrast included in the plurality of contrasts.

15. The method of claim 11, wherein the self-gating signal is extracted from the imaging data by samplings a plurality of radial views included in the imaging data.

16. The method of claim 11, further comprising:
    generating a respiratory signal by tracking a physiological characteristic related to the patient's breathing using a sensor external to the MRI system; and
    determining the plurality of respiratory motion phases based on the respiratory signal.

17. The method of claim 11, wherein the imaging data is acquired using a stack-of-radial imaging sequence with golden-angle ordering.

18. The method of claim 11, wherein the imaging data is acquired using a 3D radial sequence.

19. The method of claim 11, wherein the biomarker parameter maps comprise a Proton density Fat Fraction (PDFF) parameter map.

20. The method of claim 11, wherein the biomarker parameter maps comprise a transverse relaxation rate ($R_2^*$) parameter map.

* * * * *